(12) United States Patent
Kraus

(10) Patent No.: US 9,023,426 B2
(45) Date of Patent: May 5, 2015

(54) METHOD FOR PRODUCING CRACK-FREE POLYCRYSTALLINE SILICON RODS

(75) Inventor: Heinz Kraus, Zeilarn (DE)

(73) Assignee: Wacker Chemie AG, Munich (DE)

( * ) Notice: Subject to any disclaimer, the term of this patent is extended or adjusted under 35 U.S.C. 154(b) by 1108 days.

(21) Appl. No.: 13/033,237

(22) Filed: Feb. 23, 2011

(65) Prior Publication Data

US 2011/0229717 A1 Sep. 22, 2011

(30) Foreign Application Priority Data

Mar. 19, 2010 (DE) .................. 10 2010 003 068

(51) Int. Cl.
| | | |
|---|---|---|
| C23C 16/24 | (2006.01) | |
| H01L 21/20 | (2006.01) | |
| C23C 16/44 | (2006.01) | |
| C01B 33/035 | (2006.01) | |

(52) U.S. Cl.
CPC ....... *C23C 16/4418* (2013.01); *Y10T 428/2933* (2015.01); *C01B 33/035* (2013.01); *C23C 16/24* (2013.01)

(58) Field of Classification Search
CPC ................................ H01L 21/20; C23C 16/24
USPC ............................ 427/248.1, 255.23, 255.393
See application file for complete search history.

(56) References Cited

U.S. PATENT DOCUMENTS

| | | | |
|---|---|---|---|
| 4,921,026 A | | 5/1990 | Flagella et al. |
| 4,981,102 A | * | 1/1991 | Gautreaux et al. ............ 118/725 |
| 5,284,640 A | | 2/1994 | Jernegan et al. |
| 5,478,396 A | * | 12/1995 | Keck et al. .................... 118/719 |
| 5,593,465 A | | 1/1997 | Seifert et al. |
| 6,309,467 B1 | | 10/2001 | Wochner et al. |
| 6,350,313 B2 | * | 2/2002 | Kraus et al. .................... 117/13 |
| 6,676,916 B2 | | 1/2004 | Keck et al. |
| 2001/0032583 A1 | * | 10/2001 | Kraus et al. .................... 117/84 |
| 2003/0180201 A1 | * | 9/2003 | Belt et al. ...................... 422/196 |
| 2004/0261974 A1 | * | 12/2004 | Pigatto ............................ 165/70 |
| 2008/0286550 A1 | * | 11/2008 | Sofin et al. .................... 428/220 |
| 2009/0295361 A1 | * | 12/2009 | Ellinger et al. ................ 323/318 |
| 2011/0206842 A1 | * | 8/2011 | Revankar et al. .......... 427/248.1 |
| 2012/0100302 A1 | * | 4/2012 | Fabry et al. ................... 427/534 |

FOREIGN PATENT DOCUMENTS

| | | |
|---|---|---|
| CN | 101311351 A | 11/2008 |
| DE | 197 41 465 A1 | 3/1999 |
| DE | 10 2007 023041 A1 | 11/2008 |
| JP | 63074909 A2 | 4/1988 |
| JP | 2111613 A | 4/1990 |
| JP | 2006240934 A | 9/2006 |
| JP | 2007107030 A | 4/2007 |
| WO | WO 2010/133386 A1 | 11/2010 |

OTHER PUBLICATIONS

Del Coso, Gonzalo, et al., "Disclosing the Polysilicon Deposition Process". 25th European Photovoltaic Solar Energy Conference and Exhibition/ 5th World Conference on Photovoltaic Energy Conversion, Sep. 6-10, 2010, Valencia, Spain, pp. 1216-1219.*
Tellenbach, A, "Polysilizium geht online: Der Elinsatz von Prozess-Gaschromatohrphen in der Polysilizium-Produktion". Siemens Presentation Nov. 8-9, 2010 Waldbronn, Deutschland, pp. 1-16.*
Martinez, J. et al., "Solar Cells from Polysilicon Rods". Electronic Letters, vol. 12, No. 25, Dec. 9, 1976, pp. 671-672.*
PatBase abstract for JP 2006-240934.
PatBase abstract in English JP63074909.

* cited by examiner

*Primary Examiner* — Bret Chen
(74) *Attorney, Agent, or Firm* — Caesar Rivise, PC

(57) ABSTRACT

A method for producing polycrystalline silicon rods by deposition from the gas phase on a thin rod, wherein one or a plurality of disks consisting of a material having a lower electrical resistivity than the polycrystalline silicon under deposition conditions are introduced above the electrodes and/or below the bridge of the rod pair.

14 Claims, No Drawings

METHOD FOR PRODUCING CRACK-FREE POLYCRYSTALLINE SILICON RODS

BACKGROUND

The invention relates to a method for producing polycrystalline silicon rods having a large diameter, in which disks composed of a material having a lower electrical resistivity than the polycrystalline silicon are introduced in order to avoid cracking and chipping in the silicon rod.

During the deposition of polysilicon according to the Siemens process, high-purity elemental silicon is deposited from the gas phase on the surface of silicon rods. In this case, in a deposition reactor, from a mixture of hydrogen and halosilanes or a hydrogen-containing silicon compound, elemental silicon is deposited from the gas phase on the surface of a thin silicon rod heated to 900 to 1200° C.

In this case, the silicon rods are held in the reactor by specific electrodes, which generally consist of high-purity electrographite. In each case two thin rods having a different voltage polarity at the electrode mounts are connected at the other thin rod end by means of a bridge to form a closed electric circuit. Electrical energy for heating the thin rods is fed via the electrodes and the electrode mounts thereof. A mixture of hydrogen and halosilanes is added via inlet nozzles at the baseplate of the deposition reactor. In this case, the halosilanes decompose at the surface of the thin rods. In this case, the diameter of the thin rods increases. At the same time, the electrode grows, starting at its tip, into the rod foot of the silicon rods. After a desired setpoint diameter of the silicon rods has been attained, the deposition process is ended, and the glowing silicon rods are cooled and demounted.

A particular importance is accorded here to the material and the shape of the electrodes. They serve, firstly, for retaining the thin rods, for transferring the current flow into the silicon rod, but also for transferring heat and also as a secure stage for the growing rod in the reactor. Since the trend is toward ever longer and heavier rods and the rod pairs, which in the meantime can have a weight of hundreds of kilograms, are only anchored by means of the electrodes in the reactor, precisely the choice of the shape and of the material constitution is very important.

Electrodes according to the prior art consist of a cylindrical base body in the lower part and a conical tip in the upper part. A hole for receiving the thin rod is provided at the conical tip. In this case, the lower end of the electrode is placed into a metallic electrode mount, via which the current is fed in. Such electrodes are generally known and are used for silicon deposition for example in U.S. Pat. No. 5,284,640.

Graphite is principally used as material for the electrodes since graphite is available with very high purity and is chemically inert under deposition conditions. Furthermore, graphite has a very low electrical resistivity.

After the deposition process, the obtained U-shaped rod pairs composed of polysilicon are cut to length on the electrode side and on the bridge side. The rods obtained have to be free of cracks and break-offs at both rod ends and over the entire rod length. Afterward, the rods thus obtained are cut to length to form rod pieces, where it is necessary to comply with customer requirements such as rod length and rod weight. These rods also have to be free of cracks and chipping-off on both sides and over the entire rod length.

What is disadvantageous about all the electrodes known from the prior art is that said electrodes, at the transition between electrode and the silicon rod or in the silicon rod in the vicinity of the electrode, tend to a greater or lesser extent to cracking or to chipping-off of the material and thus make the silicon rod unstable.

In order that a high yield of crack-free rod length is obtained, the electrode- and bridge-side rod ends of the obtained U-shaped rod pairs composed of polysilicon are intended to have cracks and chipping-off to the least possible extent, and ideally not at all. Rod regions having cracks signify a high outlay when cutting the rods to length, since the rod ends are cut to length in slices until freedom from cracks is reached.

Length, diameter and weight of the processed polysilicon rods are part of the customer specification. The customer requirements are shifting further and further toward long and thick rods. On the other hand, cracks and break-offs increase as the deposition diameter increases during production. A method for avoiding cracks therefore has high economic potential.

There are already various publications for avoiding cracks and chipping-off in rods composed of polycrystalline silicon.

U.S. Pat. No. 6,676,916 describes, for example, a method in which small flaws such as holes or notches are provided in the thin rods below the bridge. Further possibilities mentioned include thickening of the thin rod by compression or constriction of the conduction cross-section. At these defects, a cleavage plane is intended to be formed during the deposition as a result of disrupted crystalline growth. In the event of thermal strains, these planes are then intended to act as preferred fracture locations.

Thick and crack-free polysilicon rods are used in production processes such as, for example, the floating zone process, the recharging of Czochralski processes or the cutting of new thin rods. These processes presuppose a smooth rod surface and a compact rod cross-section without flaws and without regions having different crystal structures in the rod. Therefore, a uniform crystal structure of the polysilicon rods is necessary during the deposition process. Small flaws on the thin rod, such as are proposed in U.S. Pat. No. 6,676,916, completely grow together during such deposition processes even in the case of a thin rod diameter. As a result, the region no longer acts as a preferred fracture location in the case of thick rods.

JP-63074909 discloses a method for avoiding cracks and chipping-off in which the silicon rods are heated by high-frequency AC current. With high-frequency AC current, the current density is shifted toward the rod edge according to the so-called skin effect. The temperature difference between rod center and rod surface can thereby be kept small. The higher the frequency, the greater the shift in the current density to the rod edge. In order to achieve an appreciable effect, frequencies of >100 kHz are necessary. What is disadvantageous about this method is that in conjunction with the high current intensities and voltages necessary for heating the rods, a very costly shielding of power supply and deposition installation becomes necessary. Under practical and economic conditions, therefore, this method can be implemented only with difficulty.

No method known from the prior art made it possible, with the large rod diameters customary nowadays, to provide economic and simple methods that prevent cracking and the occurrence of chipping-off in the region of the transition to the rod foot and to the rod bridge.

Consequently, the object was to provide a simple method for producing silicon rods having a large diameter, which method brings about a reduction of cracks and break-offs both at the bridge-side and at the electrode-side rod ends and thus increases the crack-free rod length after the rod ends have been cut to length.

Surprisingly, it has now been found that, by incorporating disks above the electrodes used and below the bridge between the two rods of a rod pair, said disks consisting of a material having a lower electrical resistivity than the polycrystalline silicon under deposition conditions, the rod length free of cracks and free of chipping-off can be significantly increased.

SUMMARY OF THE INVENTION

The invention relates to a method for producing polycrystalline silicon rods by deposition from the gas phase on a thin rod, wherein one or a plurality of disks consisting of a material having a lower electrical resistivity than the polycrystalline silicon under deposition conditions are introduced above the electrodes and/or below the bridge of the rod pair.

The use of the disks according to the invention has made it possible for the current density in the rods to be made more uniform. For this purpose, disks composed of a material having a significantly lower ohmic resistance than that of silicon are fixed above the electrodes and below the bridge of the rods. It is also possible to insert the disks only on the electrode side or only on the bridge side. In this case, the positive effect of the disks with regard to avoiding cracks and break-offs is reduced only to the rod end at which the disk was introduced.

The disks can be inserted at an angle of 45 to 90° with respect to the rod axis, preferably 60 to 90° and particularly preferably 90° with respect to the rod axis.

Depending on the desired rod diameter, the disks according to the invention have a diameter of between 30 and 250 mm, preferably 50 to 220 mm, and particularly preferably 90 to 200 mm. The disk diameter for the bridge-side disks ideally corresponds to the desired rod diameter. The electrode-side disk diameter can be somewhat smaller provided that the disk bears on the electrode tip. Here, the ideal disk diameter is approximately 80% of the average rod diameter.

The disk thickness is between 0.5 and 100 mm, preferably between 1 and 20 mm, particularly preferably between 2 and 10 mm.

Suitable material for the disks according to the invention includes all materials having a high melting point which are resistant to hot silicon in the temperature range up to 1300° C. and which have a lower electrical resistivity than the polycrystalline silicon under deposition conditions, that is to say that the resistivity of the disk material is less than 100 µohm*m in the temperature range of between 900 and 1200° C. In the case of graphite as disk material, at 20° C., this corresponds to an electrical resistivity of less than 130 µohm*m. Suitable materials are metals having a high melting point such as tungsten and tantalum or graphite.

Further suitable materials are doped polycrystalline or monocrystalline silicon, silicon carbide or CFC (carbon fiber reinforced carbon) composite materials, preferably monocrystalline silicon. For purity reasons, high-purity electrographite is particularly preferred. A coating of the graphite parts with silicon, silicon carbide, pyrocarbon, silicon nitride, glassy carbon or silicene, i.e. nano silicon, is likewise possible. In this case, a layer thickness of less than 100 µm is preferred.

The arithmetic mean roughness value of the surface roughness Ra of the disk used, measured according to DIN EN ISO 4287, is between 1 and 20 µm, preferably between 1 and 15 µm, particularly preferably between 1 and 10 µm, given a total height of the roughness profile Rt of between 10 and 200 µm, preferably between 10 and 150 µm, particularly preferably between 10 and 100 µm, and an averaged roughness depth Rz of between 8 and 160 µm, preferably between 8 and 120 µm, particularly preferably between 8 and 80 µm.

For optimally avoiding thermal strains, the electrical resistivity of the disks at deposition temperature—in the case of isotropic materials in particular in the disk plane—must be significantly less than that of high-purity silicon. The resistivity of the disks, at 20° C., measured according to DIN 51911, should be less than 130 µohm*m, preferably less than 75 µohm*m, and particularly preferably less than 30 µohm*m.

The disks according to the invention can be used in conjunction with all electrodes known from the prior art. Said electrodes are preferably composed of electrographite, having a lower electrical resistivity than high-purity silicon. The shape of said electrodes is conical with a central tip toward the silicon rod, said tip carrying the thin rod.

The optimum position of the electrode-side disk is at the rod foot directly above the electrode. The disk is preferably inserted at a distance of 0 to 1000 mm, measured from the electrode tip. Placing the disk onto the electrode tip is particularly preferred. For this purpose, a conical hole can simply be introduced into the disk center, by means of which hole the disk can be appropriately plugged onto the electrode tip and through which hole the carrier rod (thin rod) is plugged into the electrode. The disk can also be positioned up to a range of 20 mm below the electrode tip, the positive effect of the disks decreasing as the distance below the electrode tip increases.

On account of the lower resistivity of the disk, the supply of current into the rod foot is no longer effected centrally via the electrode tip into the rod foot, but rather in a manner made more uniform over the disk cross-section. The temperature gradient from rod center to the rod surface in the rod foot is significantly smaller as a result.

Furthermore, the disks act like a predetermined fracture location which reduces remaining residual stresses as a result of the formation of conical cracks at the rods in the region of the disks. In the range up to 100 mm above and below the disks, conical cracks still occur upon cooling, such that the remaining rod ends have a slightly pointed shape.

The rods are already free of cracks and break-offs at the end of the conical cracks, approximately 100 mm above the electrode-side disks and 100 mm below the bridge-side disks.

An electrode according to the prior art, supplemented by the form of a disk according to the invention, together made of one piece, is likewise possible and has the same effect. However, owing to the large disk diameter in comparison with the electrode diameter, the production in one piece is less favorable than the separate production of an electrode and a disk made of individual parts.

Alongside the disks at the rod foot, it is optionally also possible to insert a disk at the upper end of the rod, at the transition to the bridge of a rod pair. The disk according to the invention is preferably inserted 200 to 1000 mm below the bridge, preferably 200 to 800 mm and particularly preferably 300 to 600 mm, in each case relative to the thin rod bridge.

Said disk is preferably inserted at a right angle with respect to the rod axis. An angle deviating from 90° with respect to the rod axis is possible here, but reduces the effect of the disk.

The disk can be inserted directly into the thin rod or else be fixed by means of an adapter. For this purpose, the disks preferably have a cylindrical hole in the disk center. The vertical position of the disks is dependent on the end diameter of the rods. It should be chosen such that the disk still lies below the bridge arch after the desired rod diameter has been attained. The topmost position, at which the bridge-side disk still lies in the straight part of the rod legs, is nearer to the bridge in the case of thinner rods than in the case of thicker rods. Positions that are deeper and hence more distant from the bridge are possible, but the crack-free rod length subsequently obtained is reduced in this case.

Below the disk according to the invention in proximity to the bridge, the current density is made more uniform and increases only to a small extent on account of the specific thermal conductivity and the temperature dependence of the electrical resistivity of silicon from the rod surface to the rod center in the form of concentric circles. The rods can be cut to length approximately 100 mm below the bridge-side disks in a manner free of cracks and break-offs.

Since the thin carrier rods can fluctuate on account of the gas flow in the reactor, it is expedient to fix the bridge-side disks of adjacent carrier rods at slightly different heights. Height differences of between 20 and 50 mm have proved to be worthwhile here in experiments. Large height differences are possible, but shorten the usable rod length of the rods with the lower disk position. In this case, disks of adjacent carrier rods are positioned at different heights. This prevents momentary contact between disks of adjacent rod pairs as a result of fluctuating carrier rods. A collision of adjacent disks can lead to fracture of disks and carrier rods with outage of the deposition installation.

The disks according to the invention are fixed either by simple placement onto the electrodes or by means of suitable adapters or sleeves. Simple adapters can be, for example, elongate connecting bodies each having a cavity, e.g. a hole, at the ends. By means of the adapter, two thin carrier rods can be connected to form a longer carrier rod simply by being plugged together. The adapter additionally bears a device for receiving the disk according to the invention. This may be an edge or collar, for example, on which the disk bears.

Suitable material for adapters includes all materials having a high melting point which are resistant to hot silicon in the temperature range up to 1300° C. and which are electrically conductive in the temperature range greater than 900° C. Suitable materials are metals having a high melting point such as tungsten and tantalum or graphite.

Further suitable materials are doped polycrystalline or monocrystalline silicon, silicon carbide or CFC (carbon fiber reinforced carbon) composite materials, preferably monocrystalline silicon. For purity reasons, high-purity electrographite is particularly preferred. A coating of the graphite parts with silicon, silicon carbide, pyrocarbon, silicon nitride, glassy carbon or silicene, i.e. nano silicon, is likewise possible. In this case, a layer thickness of less than 100 μm is preferred.

Adapter and disk can be produced from different materials or from the same material. High-purity electrographite is preferably used for both parts. Adapter and disk can consist of two separate parts or of one part. In both embodiments, the function is not adversely affected. On account of the large disk diameter in comparison with the adapter diameter and the small disk thickness relative to the adapter length, two separate parts are preferred for economic reasons.

The electrical resistivity of the adapter can also be greater than that of silicon; at all events, the adapter must be electrically conductive. Ideally, the adapter has an electrical resistivity less than or equal to that of undoped crystalline silicon.

Further additional disks on positions between an electrode-side disk and a bridge-side disk are likewise possible. Preferably, these are fitted at planned cutting positions for cutting the rods to the subsequently required length. However, the additional disks are not absolutely necessary since the rods between bridge-side disk and electrode-side disk exhibit low thermal strains. However, they do facilitate subsequent cutting to length.

At deposition temperature, the disks have to have an electrical resistivity which is significantly less than that of silicon. On account of the low electrical resistivity of the disk in comparison with silicon, between bridge-side and electrode-side disks a current density made more uniform over the rod cross-section is established in the silicon rods, which is independent of the vertical position (electrode side, rod center, bridge side) at the rod.

In a further embodiment of the invention, additional disks can be incorporated as subsequent predetermined fracture locations at any desired locations of the U-shaped rod pair, preferably in the bridge. The effect of these disks with regard to avoiding cracks and thermal strains is not based on making the current density more uniform, but rather merely as a predetermined fracture location. During the cooling of the rods, thermal strains as a result of cracking in direct proximity to the disks are reduced in the region of the disks, such that the remaining rod is damaged to a lesser extent. The disks are likewise positioned by means of adapters below the bridge or in the bridge.

The bridge-side disk having the sole function as a predetermined fracture disk can be composed of a material having a lower electrical conductivity than silicon. In this case, the electrical resistivity must at least have a magnitude such that a current flow through the disks is possible.

Suitable materials are metals having a high melting point such as tungsten and tantalum, doped or undoped polycrystalline or monocrystalline silicon, graphite, silicon carbide, silicon nitride, CFC composite materials, preferably undoped monocrystalline or polycrystalline silicon. A coating of the graphite parts with silicon, silicon carbide, pyrocarbon, silicon nitride, glassy carbon or silicene, i.e. nano silicon, is likewise possible. In this case, a layer thickness of less than 100 μm is preferred.

In one embodiment of the invention, at least one disk is inserted in the bridge. This can be done by means of the adapters already described, or else simply by hanging into a groove transversely with respect to the bridge in order to prevent the lateral slipping of the disk on the bridge. The disk can be inserted into the bridge centrally and eccentrically, relative to its midpoint. In this embodiment, the hole in the disk should lie in the region between midpoint of the disk and 0.8× disk radius, preferably in the region between 0.2× disk radius and 0.6× disk radius, particularly preferably between 0.2× disk radius and 0.4× disk radius.

The hole is of a size precisely such that the bridge can be plugged through the disk. In the simplest case, the hole is circular or in the form of an ellipse; it ideally corresponds to the cross section of the bridge in terms of size and form. Depending on the desired rod diameter, the disks have a diameter of between 30 and 250 mm, preferably 50 to 220 mm, particularly preferably 90 to 200 mm. The disk diameter for the bridge-side disks ideally corresponds to the desired rod diameter.

Since the disks have no particular electrical function in the bridge, the disks can have a very small thickness. The latter is in the range of 0.5 to 10 mm, preferably 1 to 5 mm, and particularly preferably 1 to 3 mm.

When electrode-side and bridge-side disks are used, given a carrier rod length of 3000 mm, after cutting to length, it is possible to obtain polycrystalline silicon rods having a length free of cracks and break-offs which is greater than 1400 mm, preferably greater than 1850 mm, and particularly preferably greater than 2000 mm. The method according to the invention can be used to produce polycrystalline silicon rods free of cracks and break-offs with a diameter of between 130 and 250 mm, preferably between 160 and 220 mm, particularly preferably between 180 and 220 mm.

The polycrystalline silicon rods produced according to the invention can be used for the production of monocrystalline silicon by means of the floating zone method (FZ). In this case, they have the property that during the pulling process no additional chipping-off occurs that would inevitably lead to the end of the pulling process and thus drastically reduce the FZ yield. Furthermore, the use of the rods produced according to the invention reduces the probability of dislocations in the FZ method. The rods can be pulled in a manner free of dislocations in a pulling pass. Furthermore, the polysilicon rods can be melted without breakoffs into the crucible for the CZ pulling process, in order to increase the degree of filling of the crucibles. A further application is short polycrystalline silicon rods free of cracks and break-offs for densely filling the crucible during the CZ pulling process in conjunction with poly chips having different fragment sizes for the interspaces of the rod pieces.

DETAILED DESCRIPTION OF PREFERRED EMBODIMENTS

The invention will be explained in greater detail on the basis of the following examples.

Polycrystalline silicon rods were deposited from the gas phase according to the Siemens method in a deposition reactor. Graphite electrodes according to the prior art (for the shape see the U.S. Pat. No. 5,593,465), i.e. having an elongate shape, were mounted at the upper end with a conical tip. The graphite electrode has a hole at the tip in a longitudinal direction, into which hole a thin carrier rod was plugged. In each case 2 adjacent carrier rods are connected at the upper end to a thin carrier rod in a U-shaped manner to a bridge. The two ends of the electrode mount outside the deposition reactor were connected to an electrical voltage source to form a closed electric circuit. As a result of current flowing through directly, the carrier rods were electrically heated to 900 to 1200° C. A feed consisting of one or more chlorine-containing silane compounds of the formula $SiH_nCl_{4-n}$ (where n=0 . . . 4) and hydrogen as carrier gas was added during the deposition process. The halogen-containing silane compound decomposes at the surface of the thin rods, polycrystalline silicon growing on the latter. After the desired diameter of between 130 and 220 mm had been attained, the reaction was ended, and the rods were cooled and demounted from the deposition reactor.

Example 1

A disk composed of high-purity electrographite with an appropriate, central hole was respectively plugged onto the tip of the graphite electrodes. The tip of the graphite electrode terminated flush with the disk surface. The disk had a diameter of 130 mm and a thickness of 4 mm. Carrier rods having a length of 2500 mm and 2550 mm were plugged into the graphite electrodes in such a way that a rod pair always contained a longer and a shorter carrier rod and adjacent rods had different lengths. Adapters and sleeves for connecting two carrier rods to form a longer carrier rod were plugged onto the ends of the carrier rods. The adapters consisted of high-purity electrographite. Shorter carrier rods having a length of 500 mm and 450 mm were plugged into the other adapter end in such a way that all the carrier rods had a total length of 3000 mm. The adapters simultaneously served for fixing a respective high-purity graphite disk below the bridge. The disks were plugged and placed onto the adapter by means of a central hole. The disks on the adapters had a diameter of 180 mm and a thickness of 4 mm. Electrode- and bridge-side disks formed an angle of 90° in each case with the thin rod. The disks had an electrical resistivity, measured at room temperature according to DIN 51911, of less than 30 µohm*m. Polycrystalline silicon was deposited onto the carrier rods incorporated in this way, until a diameter of 180 mm was attained. The finished polycrystalline silicon rods were able to be cut to length between electrode- and bridge-side disks with only low cutting losses at both ends in a manner free of cracks and break-offs, such that the finished processed rods were free of cracks and break-offs over their entire length.

90% of the polycrystalline silicon rods according to the invention that were produced in this way had a length of greater than 2100 mm, and the remaining rods were between 1900 mm and 2100 mm. The rods were subsequently able to be pulled in one go to form single crystals in a manner free of dislocations by means of the floating zone method. On account of the high weight of the crack-free polycrystalline rods, they were particularly suitable for use for pulling single crystals having a large diameter, here 8 inches.

Comparative Example 1

A procedure analogous to Example 1 was employed. However, a comparative group of rods was deposited with thin rods having a length of 3000 mm made of one piece, that is to say without upper disks and without adapters, in other words with the same parameters. Only the disk according to the invention was used on the electrodes.

Owing to intensified cracking at the bridge-side rod ends, the rods had to be shortened to a greater extent on the bridge side until rods free of cracks and break-offs were attained, such that only 20% of the processed rods were longer than 2100 mm, while 70% of the rods had a length of between 1800 mm and 2100 mm. The rest of the rods only had a length of less than 1800 mm. The crack-free rods were likewise able to be pulled to 8 inches in a manner free of dislocations by means of the floating zone method, but with a lower pulling yield and lower installation output owing to the shorter rod lengths.

Comparative Example 2

A procedure analogous to Comparative Example 1 was employed and, in addition, the electrode-side disks were also omitted. The rod pairs therefore had no disks and deposition was effected analogously to the prior art. In addition to the bridge-side cracks, the electrode-side rod ends were then also cracked to an increased extent. The bridge-side cutting losses were then also accompanied to an increased extent by cutting losses at the electrode-side rod end in the course of cutting the rods to length until crack-free rods were attained. There were no crack-free rods having a length of greater than 1800 mm. 15% of the rods obtained had a length of between 1500 mm and 1800 mm. 55% of the rods were in the range of 1200 mm to 1500 mm, and 14% were between 1000 mm and 1200 mm. The remaining rods were unusable for the floating zone method owing to an excessively short crack-free rod length. In this case, too, the polycrystalline silicon rods were able to be pulled in a manner free of dislocations by means of the floating zone process. On account of their low weight, however, they were not suitable as preliminary rods for pulling 8 inch single crystals, but rather only for single crystals having a diameter of 6 inches or less.

Example 2

A disk composed of high-purity electrographite with an appropriate, central hole was respectively plugged onto the tip of the graphite electrodes. The tip of the graphite electrode terminated flush with the disk surface. The disks had a respective diameter of 120 mm and a thickness of 4 mm. The graphite electrodes were equipped with carrier rods having a length of 2400 mm. A respective disk composed of polycrystalline silicon was hung into the bridge of the rod pairs. The diameter of the disk in the bridge was 150 mm given a disk thickness of 2 mm. The hole for hanging the disk into the bridge was eccentric with a distance from the midpoint of 0.3× disk radius. The disk was secured against slipping by means of a notch in the bridge. Polycrystalline silicon was deposited from the gas phase onto the carrier rods that had been incorporated in this way, until a diameter of 160 mm was reached.

After the rod pairs had been demounted from the deposition installation, 80% of the rod pairs were fractured at the disk in the bridge. The bridge-side rod ends had only a few cracks, such that, after the bridge parts had been cut to length, only little additional cutting waste arose at the bridge-side rod ends until rod ends free of cracks and break-offs were attained. The bridge-side rod ends had to be shortened, including bridges, by 300 to 500 mm in each case. The electrode-side rod ends were free of cracks and break-offs starting from a length of 100 mm to 200 mm above the electrode-side disks. The rod lengths free of cracks and break-offs were therefore between 1700 mm and 2100 mm. From the crack-free rods, per rod 8 to 10 short rod pieces of 200 mm were able to be cut to length for filling the quartz crucible for the Czochralski pulling process.

Comparative Example 3

A procedure analogous to Example 2 was employed. However, as comparative group, deposition was effected without a disk in the bridge. At the end of the deposition process, the rod pairs had to be separated at the bridge prior to removal from the reactor. In this case, strains were released and break-offs were produced during the cutting to length. The bridge-side cutting losses until a bridge-side crack-free rod end was attained were 400 to 700 mm. Including 100 to 200 mm electrode-side cutting waste, the crack-free rod length was then 1500 to 1800 mm per silicon rod. 7 to 9 short rod pieces were able to be cut to length therefrom for filling the quartz crucible for the Czochralski pulling process.

Comparative Example 4

A procedure analogous to Comparative Example 3 was employed. In addition, the electrode-side graphite disk was also dispensed with and thus the procedure according to the prior art was adopted. The remaining process parameters remained the same. In addition to the increased bridge-side cutting waste, caused by cutting to length the bridge and the cracked bridge-side rod end, there was an increased occurrence of cutting waste at the electrode-side rod ends on account of cracks and chipping-off. After cutting to length until rods free of cracks and break-offs were attained, the rods only had a length of 1100 mm to 1500 mm. Only 5 to 7 short rod pieces were able to be cut to length therefrom for filling the quartz crucible for the Czochralski pulling process.

What is claimed is:

1. A method for producing a polycrystalline silicon rod by deposition from a gas phase on carrier rods, said method comprising:
    providing a closed electric circuit comprising at least two carrier rods joined together by a bridge and connected to two electrodes;
    providing at least one disk above the electrodes and/or below the bridge, wherein the at least one disk comprises a material having a lower electrical resistivity than polycrystalline silicon under deposition conditions, and wherein said disk is a circular object, with a thickness less than it's diameter; and
    depositing polycrystalline silicon from the gas phase onto the carrier rods to provide the polycrystalline silicon rod.

2. The method as claimed in claim 1, wherein the at least one disk has a diameter of 30 to 200 mm.

3. The method as claimed in claim 2, wherein the diameter of the at least one disk corresponds to a diameter of the carrier rods.

4. The method as claimed in claim 2, wherein the diameter of the at least one disk above the electrodes is less than the diameter of the at least one disk below the bridge.

5. The method as claimed in claim 2, wherein the at least one disk has a disk thickness of 0.5 to 100 mm.

6. The method as claimed in claim 1, wherein the at least one disk is inserted at an angle of 45 to 90 degrees relative to a rod axis.

7. The method as claimed in claim 1, wherein the at least one disk comprises tungsten, tantalum, graphite, silicon, silicon carbide, silicon nitride or carbon fiber reinforced carbon composite materials.

8. The method as claimed in claim 1, wherein a resistivity of the at least one disk at 20° C. is less than 130 μohm*m.

9. The method as claimed in claim 1, wherein an arithmetic mean roughness value of a surface roughness Ra of the at least one disk used is from 1 to 20 μm, given a total height of a roughness profile Rt of between 10 and 200 μm and an averaged roughness depth Rz of between 8 and 160 μm.

10. The method as claimed in claim 1, wherein an electrode-side disk is provided at a distance of 0 to 1000 mm from an electrode and a bridge-side disk is provided at a distance of 200 mm to 1000 mm from the bridge.

11. The method as claimed in claim 10, wherein the electrode-side disk is placed directly onto the electrode.

12. The method as claimed in claim 1, wherein the at least one disk is fixed to the carrier rods by adapters.

13. The method as claimed in claim 1, wherein at least one disk is additionally inserted into the bridge.

14. The method as claimed in claim 1, wherein said at least one disk is provided above a portion of the electrodes and below a portion of the bridge.

* * * * *